United States Patent [19]

Powers

[11] Patent Number: 5,366,847
[45] Date of Patent: Nov. 22, 1994

[54] METHOD AND APPARATUS FOR OPTIMIZING SEMICONDUCTOR EXPOSURE PROCESS

[75] Inventor: Robert Powers, Redondo Beach, Calif.

[73] Assignee: TRW Inc., Redondo Beach, Calif.

[21] Appl. No.: 113,889

[22] Filed: Aug. 30, 1993

Related U.S. Application Data

[63] Continuation of Ser. No. 840,480, Feb. 24, 1992, abandoned.

[51] Int. Cl.$^5$ ............................................. G03C 5/00
[52] U.S. Cl. ................................ 430/296; 430/327; 430/942; 250/492.3
[58] Field of Search ................ 430/296, 327, 942; 250/492.2, 492.3

[56] References Cited

U.S. PATENT DOCUMENTS 4,291,231 9/1981 Kawashima ..................... 250/492.3

Primary Examiner—Marion E. McCamish
Assistant Examiner—Kathleen Duda

[57] ABSTRACT

A method for optimizing a pattern where the shape of the pattern is replicated on a surface, where fine areas are identified within the pattern and are combined with neighboring areas so as to reduce the number of areas within the pattern too fine to properly resolve, thereby increasing the efficacy with which the pattern is replicated.

11 Claims, 6 Drawing Sheets

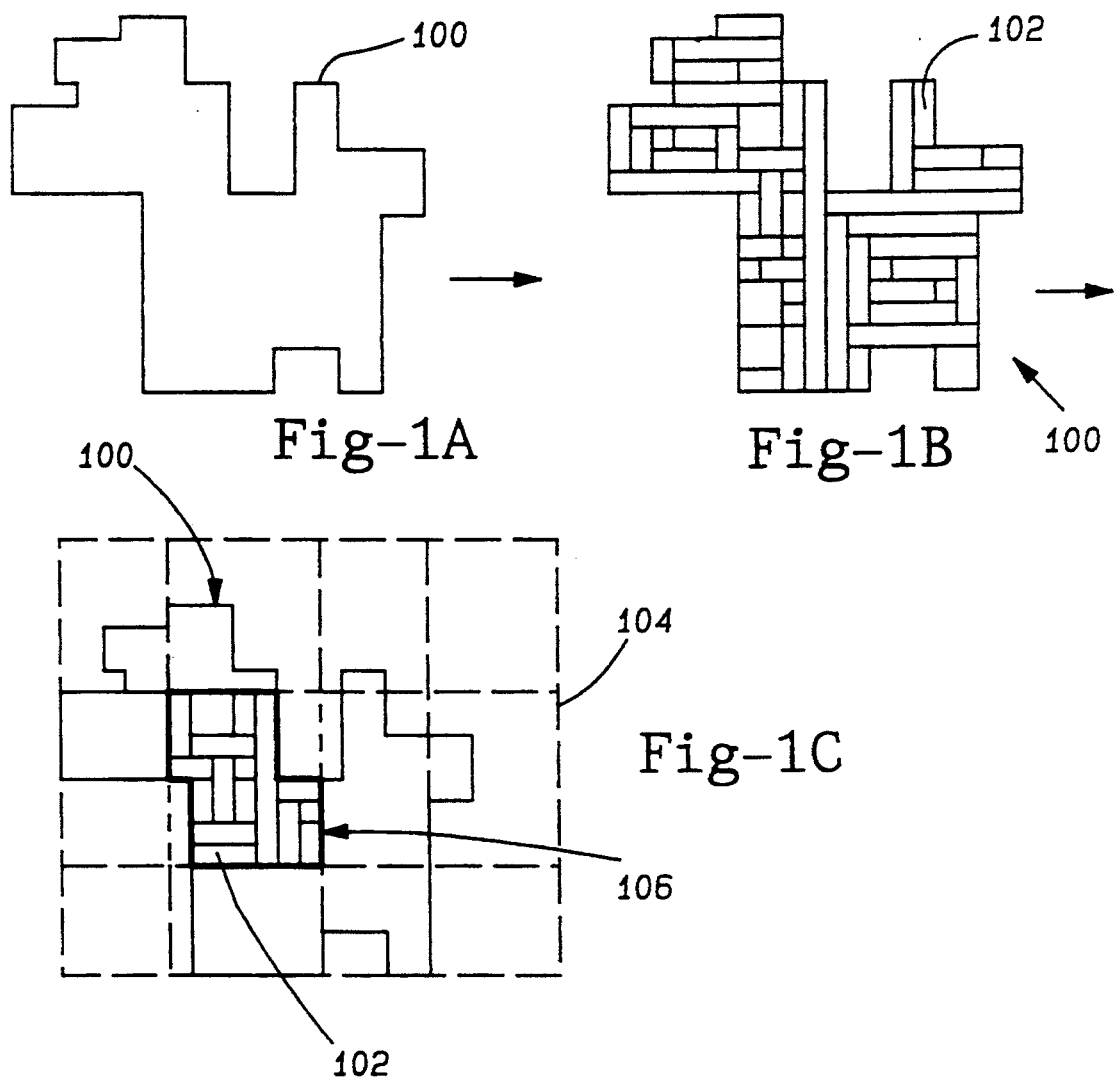
Fig-1A   Fig-1B
Fig-1C
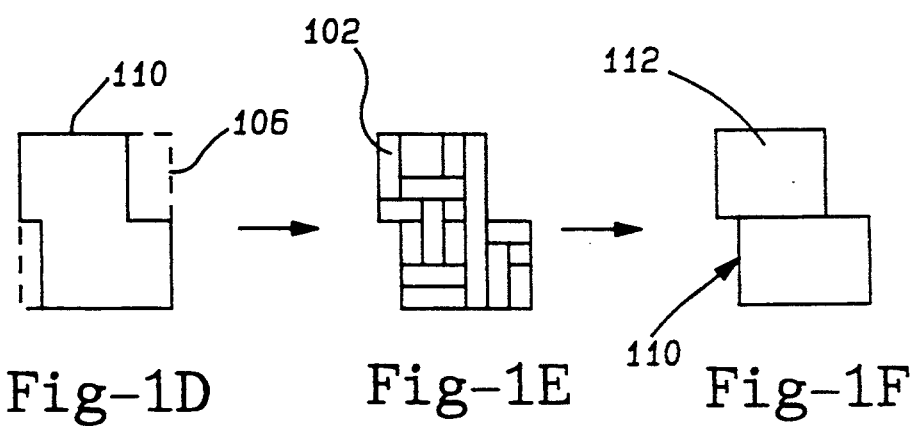
Fig-1D   Fig-1E   Fig-1F

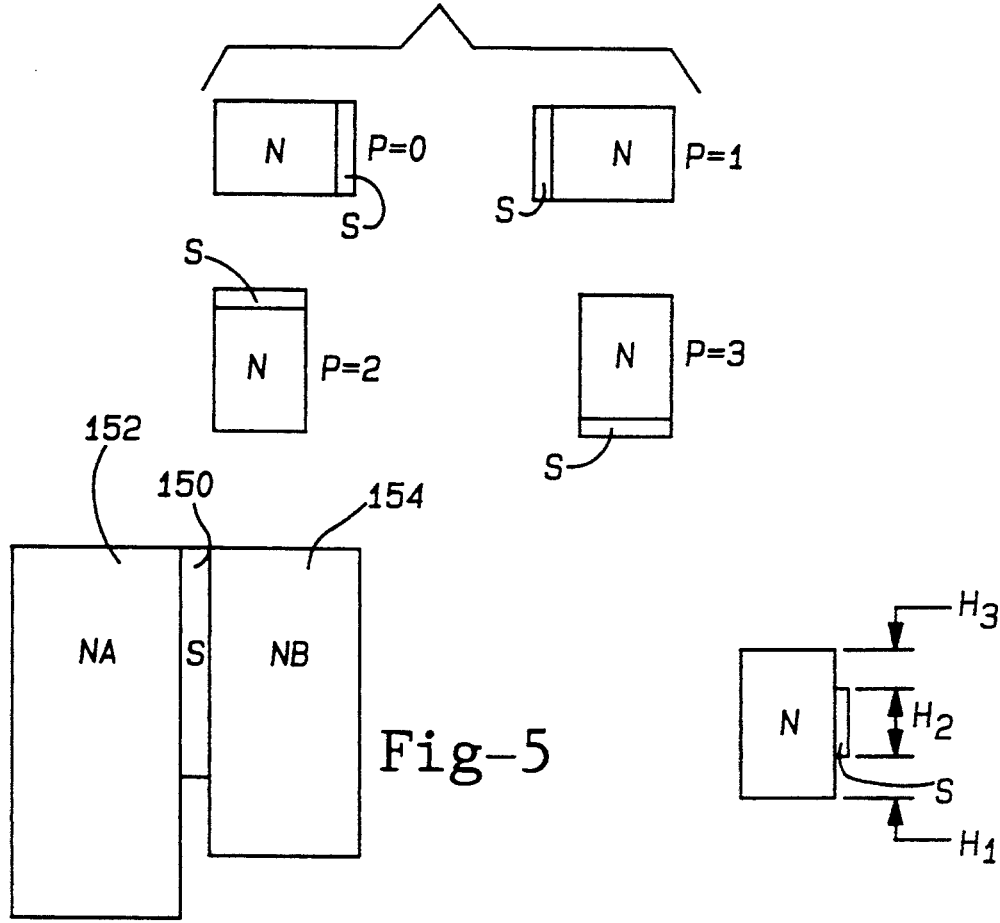
Fig-4
Fig-5
Fig-6
TYPE 1   Fig-7
TYPE 2
Fig-8
TYPE 3
Fig-9
TYPE 4   Fig-10

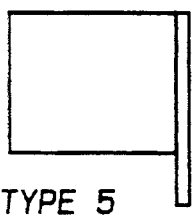
TYPE 5
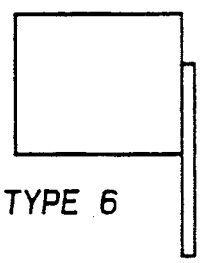
TYPE 6
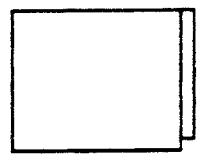
TYPE 7
Fig-11    Fig-12    Fig-13
TYPE 8
TYPE 9
TYPE 10
Fig-14    Fig-15    Fig-16
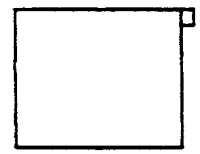
TYPE 11
TYPE 12
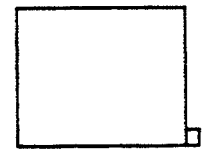
TYPE 13
Fig-17    Fig-18    Fig-19
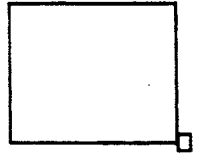
TYPE 14
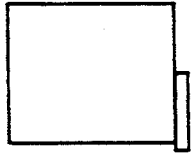
TYPE 15
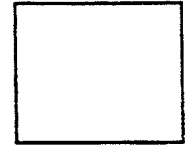
TYPE 16
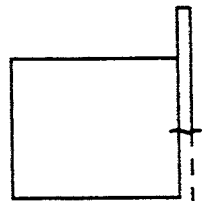
TYPE 17
Fig-20    Fig-21    Fig-22    Fig-23

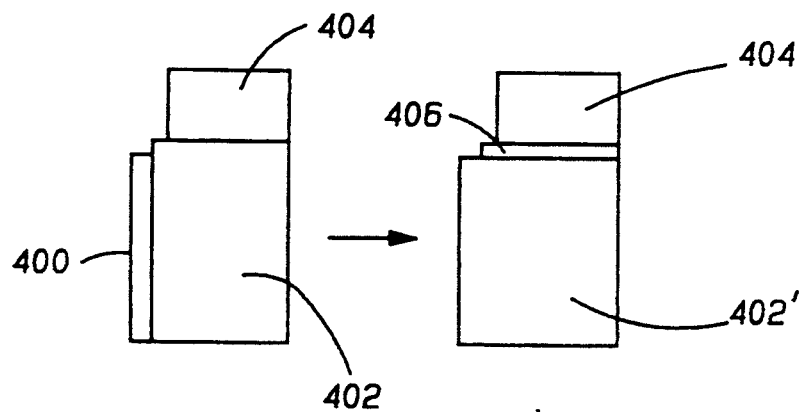
Fig-28
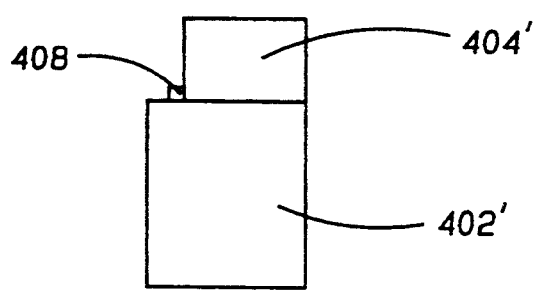
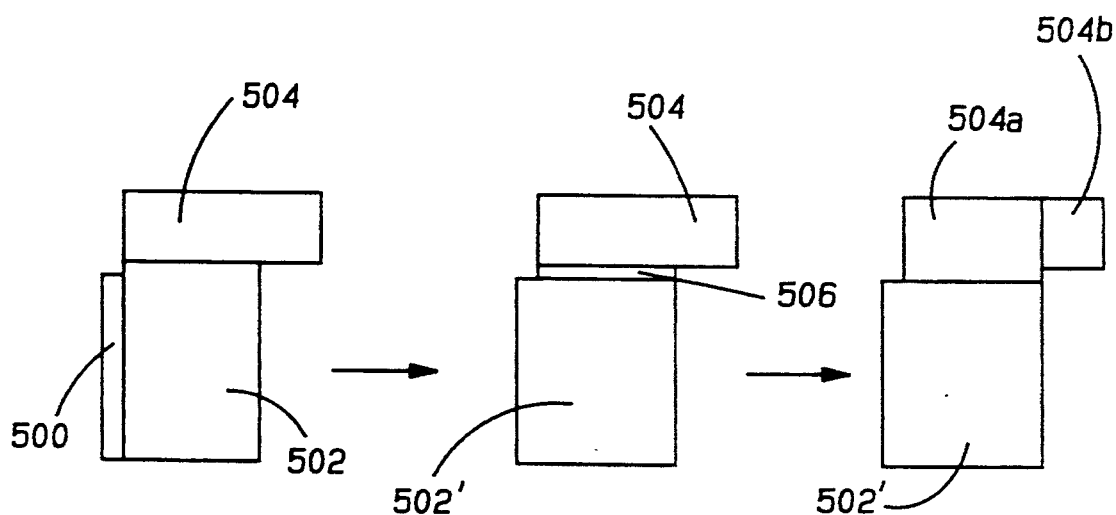
Fig-29

METHOD AND APPARATUS FOR OPTIMIZING SEMICONDUCTOR EXPOSURE PROCESS

This is a continuation of U.S. patent application Ser. No. 07/840,480, filed Feb. 24, 1992 now abandoned.

BACKGROUND OF THE INVENTION

1. Technical Field

This invention is related to the field of replicating pattern designs onto a surface, and more particularly to semiconductor mask works.

2. Discussion

In the field of semiconductor design, intricate patterns are constructed of conductive and non-conductive materials on top of a flat surface, such as a silicon wafer, or, in the case of mask making, on a piece of glass. To fabricate a semiconductor pattern, or mask, using Electron beam (commonly called "E-beam") lithography, a surface is coated with a thin layer of material, such as a metal, and then coated with an electron sensitive resist on top of the metal. A finely positioned electron beam is then used to draw the pattern on the resist. The molecular structure of the resist is altered in those areas where the electron beam is applied, while the remaining areas of the resist are unaffected. Once the pattern has been "drawn" by the E-beam, a developer is applied to the surface. The developer dissolves the resist in areas which were not exposed to the Electron beam, and an etching chemical is used to eat away the metal which lays beneath the now dissolved resist. In this way, the desired pattern is "sculptured" into the metal. Another chemical may then be used to remove the E-beam treated resist, leaving behind only the metal pattern.

Generally, a semi-conductor design has several layers, each requiring its own unique pattern.

One limitation in the design and production of semiconductor circuits lies in the ability to accurately reproduce patterns onto the resist. A complex pattern having intricate details becomes more difficult to reproduce due to inherent limitations in E-beam resolution. Thus, as patterns become smaller and smaller in order to produce more densely packed and smaller semiconductor chips, it becomes imperative to insure that the pattern does not have areas whose details are too fine to allow proper reproduction.

It would therefore be advantageous to provide a method for interrogating patterns and optimizing patterns prior to their use in semiconductor production so as to eliminate areas of the pattern which are too fine to allow proper replication during the semiconductor production process. It would be further advantageous if this method were automated to increase accuracy and speed of the optimization process. It would be further advantageous if such a method were able to optimize the pattern using as few iterations as possible.

SUMMARY OF THE INVENTION

It is therefore an object of the present invention to provide for a method and apparatus for optimizing the construction of a pattern on a semiconductor wherein an electron beam is focused to expose those portions of a resist compound lying within a desired exposure pattern. Patterns in Electron beam format consist simply of a long list of rectangles, sometimes several million. The electron beam machine draws patterns by focusing the electron beam to expose the area within one rectangle at a time. When all rectangles have been exposed, the pattern is complete. The invention optimizes a pattern by processing the list of rectangles before it is sent to the E-beam machine. First, rectangles which are too small to be accurately reproduced, called slivers, are located in the list. These slivers have a height or width dimension less than a predetermined minimum dimension, where the minimum dimension is based upon the smallest dimension for which the electron beam machine can reliably focus the electron beam. Next, neighbor rectangular figures, lying adjacent to the slivers, are identified, and the neighbor and sliver are combined to produce new rectangular figures that are not slivers. Thus, existing slivers are eliminated and new slivers are not created, thereby increasing the reliability of the electron beam exposure process and increasing the overall speed and efficacy with which the pattern is exposed.

BRIEF DESCRIPTION OF THE DRAWINGS

The various advantages of the present invention can be more readily understood by referencing the following description of the preferred embodiment and drawings in which:

FIGS. 1A–1F are an illustrative example of an exposure region and an exposure pattern composed of rectangular figures and divided into separate pattern sections;

FIG. 4 is an illustration of the various manners in which a neighboring rectangle can be oriented in relation to a sliver;

FIG. 5 illustrates a sliver having two adjacent neighboring rectangles;

FIG. 6 depicts the manner in which the geometry of the sliver and the neighboring rectangle are compared;

FIGS. 7 through 23 illustrate the relational types utilized by the present invention in order to categorize the geometric relationship between a sliver and an adjacent neighboring rectangle; and FIGS. 24–29 are illustrations showing the elimination of a sliver within a pattern section.

DETAILED DESCRIPTION OF THE PREFERRED EMBODIMENT

Figure 2:
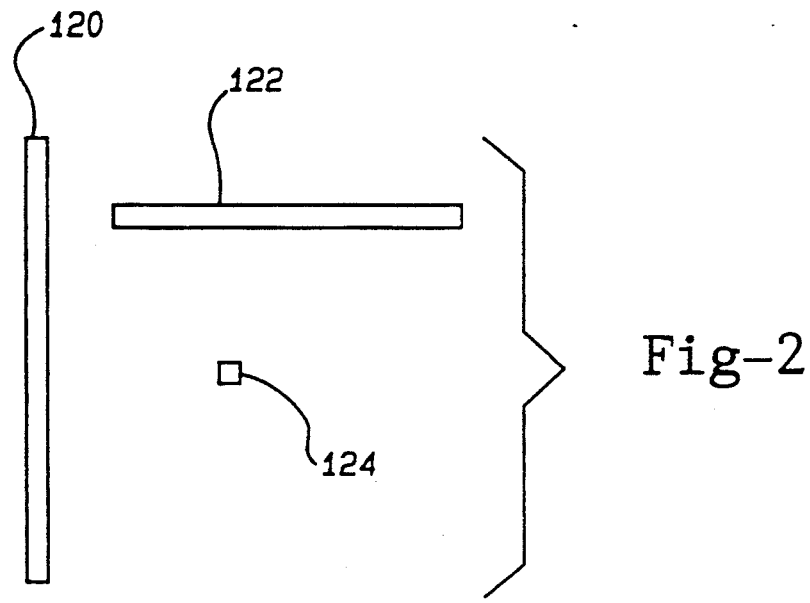
FIG. 2 is an illustration of a variety of slivers.

As was mentioned earlier, the present invention is directed at optimizing a pattern used for exposing resist coating on a surface by reducing the number of figures within the pattern where the shape of the figure is too fine to allow accurate reproduction. More particularly, a pattern used in semiconductor fabrication is optimized using an automated method which combines fine figures of a pattern with adjoining figures, creating larger figures and thus reducing the number of fine figures while increasing the speed and accuracy with which the pattern can be replicated.

FIG. 1A shows a pattern shape 100 which is to be fabricated. One way of transferring this pattern 100 onto a resist is to utilize an Electron beam (E-beam). FIG. 1B shows a pattern 100 which is composed only of rectangles 102 and is equivalent to the pattern of FIG. 1A. In E-beam format, a pattern is represented simply by a list of rectangles 102, such as in FIG. 1B. The pattern 100 and its rectangles 102 are segregated 104 into separate pattern sections 106, also called subfields, as shown in FIG. 1C. During the E-beam exposure process, the rectangles 102 are exposed one at a time, until one subfield 106 of the pattern is completed. Then the E-beam machine is directed to start exposing another sub-field 106, again one rectangle 102 at a time. When all subfields 106 are complete, the pattern 100 is completed.

As with all machines, the electron beam machine has a finite resolution. Below this minimum resolution, the electron beam cannot be accurately focused, resulting in underexposure and distortion. For example, if a rectangle smaller than the minimum finite resolution limits of the electron beam machine is attempted to be exposed, the rectangle may not come out at all on the final pattern, which can then cause problems with the performance of the circuit being constructed. When a rectangle is small enough to approach the E-beam machine's minimum resolution limit. it is referred to as a "sliver". One way slivers can be created is during the process of converting the pattern 100 from its original form into the rectangle 102 and subfields 106 that comprise E-beam format patterns. The present invention is directed toward removing slivers and thereby optimizing the manner in which the pattern is exposed. This optimization process is illustrated in FIGS. 1D through 1F. In FIG. 1D, one subfield 106 of the overall pattern 100 is illustrated in greater detail. The portion 110 of the pattern 100 in the subfield 106 has been divided into E-beam format rectangles 102. If left in this form, the electron beam machine would have to expose sixteen different rectangles 102 in this subfield 106 before being completed with the exposure of the subfield. Moreover, many of these rectangles 102 have height and/or width dimensions smaller than the minimum resolution limit. Thus, because the electron beam machine would be trying to expose slivers, the portion 110 of the pattern 100 being exposed may be underexposed, distorted or may have rectangular areas that do not come out at all. The electron beam machine utilized in the presently preferred embodiment, which is commercially available from Hitachi, has a resolution limit somewhat less than 0.5 microns. Thus, rectangles with a height or width of 0.5 microns or less would be undesirable in the pattern. Obviously, different electron beam machines may have greater or lesser resolution capabilities; but there will still be a problem of encountering figures too small to allow proper replication. The presently preferred embodiment converts these "too small" figures 102 into larger and fewer figures 112, such as illustrated in FIG. 1F. This results in the same pattern 100 being exposed but using fewer and more accurate exposure operations, increasing the accuracy and speed with which the pattern is exposed.

More particularly, the presently preferred embodiment is a method and apparatus which identifies and eliminates figures that are too fine—called "slivers"—thereby increasing the efficacy of the overall pattern fabrication. These slivers, as pictorially represented in FIG. 2, are figures which are too narrow horizontally 120, vertically 122 or both vertically and horizontally 124 to be accurately reproduced during the process of exposing the resist. In the presently preferred embodiment, this minimum dimension is 0.5 microns, as was discussed earlier. The presently preferred embodiment parses each E-beam format subfield (recall FIG. 1C) for slivers and attempts to remove these slivers. Thus, the E-beam format data is optimized prior to it being used to expose the pattern onto the resist, increasing the speed and accuracy of the exposure process.

Figure 3A:
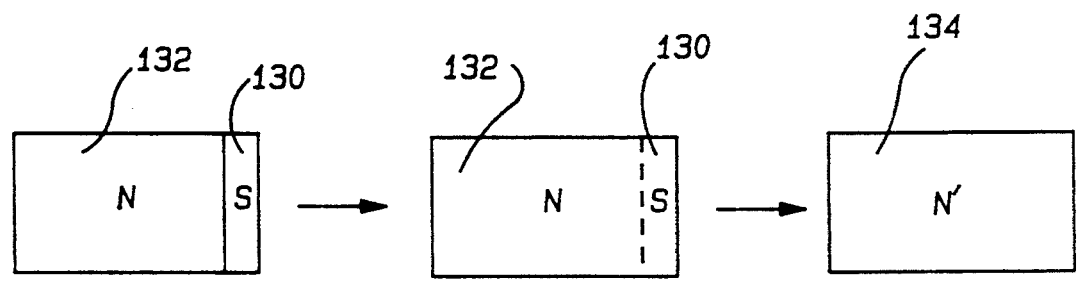
FIGS. 3A and 3B are illustrations of merging and splitting to eliminate slivers.
Figure 3B:
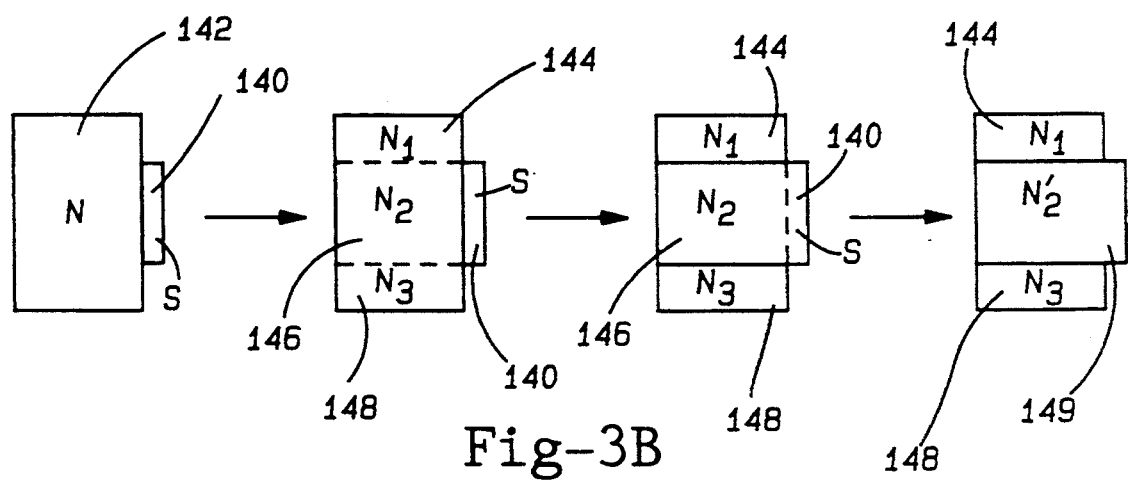

Slivers are removed by finding compatible neighboring figures ("neighbors") with which the sliver can be combined to produce a larger figure more suitable for exposing. The removal of slivers involves "splitting" and "merging". As illustrated in FIGS. 3A and 3B, splitting involves the division of a rectangle into two or more rectangles, while merging involves combining two rectangles into one. In the examples, the sliver, denoted "S", is combined with a neighbor, denoted "N", by splitting and merging. More particularly, sliver 130 is "merged" with neighbor 132 to create a single rectangular figure 134, consequently eliminating the sliver 130. In similar fashion, sliver 140 is used as a reference about which to split neighbor 142: the neighbor is split into three rectangles 144–148, and the middle rectangle 146 is merged with the sliver 140 to create a single middle rectangular area 149, consequently eliminating the sliver 140.

When attempting to eliminate a sliver by splitting and merging, an important feature of the presently preferred embodiment is that the entire sliver be eliminated. This is because, for the purposes of the presently preferred embodiment, any portion of the sliver left behind during the elimination process is still a sliver (albeit a smaller sliver). Therefore, if the entire sliver cannot be eliminated, it may be more efficient to simply leave the original sliver as-is. Because each rectangular figure represents an area where the electron beam will to expose the resist, any figure having a dimension smaller than the minimum allowable dimension is undesirable: the fact that one dimension is too small means there is a risk that the focusing of the electron beam will not be accurate.

Luckily, there is a possibility of eliminating a sliver whenever it is adjacent to a neighbor. As shown in FIG. 4, a sliver can be adjacent to a neighbor in any one of four ways: the neighbor to the left of the sliver, labelled a "P=0" perspective, the neighbor to the right (P=1), the neighbor below (P=2) or the neighbor above the sliver (P=3). The perspective of the neighbor to the sliver, as will be more fully described later in the disclosure, helps automate the manner in which slivers are removed from the pattern.

As shown in FIG. 5, a sliver can have more than one neighbor. As illustrated here, the sliver 150 has a left neighbor 152 and a right neighbor 154. In such situations, it is possible to combine the sliver with either neighbor. Therefore, the suitability of the neighbor for the purposes of combining must be determined.

The process of assessing the suitability of a neighbor for combining involves comparing the relative sizes and positions of the sliver and the neighbor. Recalling the earlier discussion regarding neighbor perspectives, a neighbor/sliver perspective of left/right (i.e. P=O or P=1) means that the sliver and neighbor are aligned vertically. Likewise, a top/bottom perspective (P=2 or P=3) means the sliver and neighbor are aligned horizontally. For those slivers and neighbors aligned vertically, the critical comparative dimensions are the Y-axis heights and relative vertical positions of the sliver and neighbor with respect to each other. Similarly, the X-axis lengths and horizontal positions are critical for horizontally aligned slivers and neighbors. As shown in FIG. 6, the critical dimensions for the vertically aligned sliver and neighbor depicted are the distances between the lower sliver Y-coordinate and the lower neighbor Y-coordinate ($H_1$), the upper and lower sliver Y-coordinates ($H_2$) and the upper neighbor Y-coordinate and the upper sliver Y-coordinate ($H_3$). These dimensions are compared to the minimum allowable dimension to determine the "type" of neighbor/sliver relationship. Recalling an earlier discussion, the minimum allowable dimension in this embodiment is 0.5 microns. Thus, if any of the distances $H_1$, $H_2$, or $H_3$ are less than 0.5 microns, there is the possibility that new slivers may be created during the process of trying to eliminate existing slivers.

When a sliver is combined with a neighbor, one or more new rectangles are created. By again referring to FIGS. 3A and 3B, this concept can be better understood. In FIG. 3A, a sliver 130 and neighbor 132, aligned vertically, perspective P=0, having the same upper and lower Y-coordinates, are combined, resulting in a single new rectangle 134. In FIG. 3B, a vertically aligned sliver 140 and neighbor 142, (where the sliver's Y-coordinate height is shorter than the neighbor's Y-coordinate height) are combined, resulting in three new rectangles. The first new rectangle 144 has a height equivalent to the difference between the neighbor's upper Y-coordinate and the sliver's upper Y-coordinate. Similarly, the second new rectangle 149 has a height equivalent to the difference between the sliver's upper and lower Y-coordinates. And, likewise, the third new rectangle 148 has a height equivalent to the difference between the sliver's lower Y-coordinate and the neighbor's lower Y-coordinate. Thus, if the height differences between the sliver and the neighbor were very slight, the first 144 and third 148 new rectangles may be slivers, i.e. less than 0.5 microns tall. If this were the result, it would be disadvantageous to create two new slivers in the process of trying to eliminate a single existing sliver, unless the two resulting slivers could be eliminated during a later iteration.

Generally, a neighbor is more desirable as a candidate for combining with a sliver if: a) combining does not create new slivers, b) the entire sliver is combined without leaving any remaining sliver portion uncombined, and c) the combination results in fewer rectangles than prior to combination. To this end, the preferred embodiment utilizes eighteen "types" of sliver/neighbor relationships. In general, a type having a lower number (e.g. 5) is more desirable than a type having a higher number (e.g. 16). In FIGS. 7–23, the various types are depicted. It can, of course, be appreciated that although FIGS. 7–23 depict the slivers and neighbors aligned vertically with the neighbor to the left (i.e. P=O perspective), the slivers and neighbors could be aligned according to any of the perspectives disclosed herein while still maintaining the same "type" relationship. Since the illustration deals with vertically aligned slivers and neighbors, the critical comparative dimensions are the Y-coordinate heights as was disclosed earlier. As such, for the purposes of illustration, the types can be defined as follows:

given: $Y_{min} = 0.5$ microns = minimum desirable dimension
$Y_{nu}$ = Y-coordinate of neighbor's upper edge
$Y_{nl}$ = Y-coordinate of neighbor's lower edge
$Y_{su}$ = Y-coordinate of silver's upper edge
$Y_{sl}$ = Y-coordinate of silver's lower edge then the types can be described as follows:

| | |
|---|---|
| Type 1 | $Y_{nu} = Y_{su}$ |
| | $Y_{nl} = Y_{sl}$ |
| Type 2 | $Y_{nu} > Y_{su}, Y_{nu} - Y_{su} > Y_{min}$ |
| | $Y_{nl} = Y_{sl}$ |
| | $Y_{su} - Y_{sl} > Y_{min}$ |
| Type 3 | $Y_{nu} = Y_{su}$ |
| | $Y_{nl} < Y_{sl}, Y_{sl} - Y_{nl} > Y_{min}$ |
| | $Y_{su} - Y_{sl} > Y_{min}$ |
| Type 4 | $Y_{nu} > Y_{su}, Y_{nu} - Y_{su} > Y_{min}$ |
| | $Y_{nl} < Y_{sl}, Y_{sl} - Y_{nl} > Y_{min}$ |
| | $Y_{su} - Y_{sl} > Y_{min}$ |
| Type 5 | $Y_{nu} = Y_{su}$ |
| | $Y_{nl} > Y_{sl}, Y_{nl} - Y_{sl} > Y_{min}$ |
| Type 6 | $Y_{nu} > Y_{su}, Y_{nu} - Y_{su} > Y_{min}$ |
| | $Y_{su} - Y_{nl} > Y_{min}$ |
| | $Y_{nl} > Y_{sl}, Y_{sl} - Y_{nl} > Y_{min}$ |
| Type 7 | $Y_{nu} = Y_{su}$ |
| | $Y_{nl} < Y_{sl}, Y_{nl} - Y_{sl} < Y_{min}$ |
| | $Y_{su} - Y_{sl} > Y_{min}$ |
| Type 8 | $Y_{nu} > Y_{su}, Y_{nu} - Y_{su} < Y_{min}$ |
| | $Y_{nl} = Y_{sl}$ |
| | $Y_{su} - Y_{sl} > Y_{min}$ |
| Type 9 | $Y_{nu} = Y_{su}$ |
| | $Y_{nl} > Y_{sl}, Y_{nl} - Y_{sl} < Y_{min}$ |
| Type 10 | $Y_{nu} > Y_{su}$ |
| | $Y_{nl} < Y_{sl}$ |
| | $Y_{su} - Y_{sl} > Y_{min}$ |
| | $Y_{nu} - Y_{su} < Y_{min}$ or $Y_{sl} - Y_{nl} < Y_{min}$ |
| Type 11 | $Y_{nu} = Y_{su}$ |
| | $Y_{nl} < Y_{sl}$ |
| | $Y_{su} - Y_{sl} < Y_{min}$ |
| Type 12 | $Y_{nu} > Y_{su}$ |
| | $Y_{nl} < Y_{sl}$ |
| | $Y_{su} - Y_{sl} < Y_{min}$ |
| Type 13 | $Y_{nu} > Y_{su}$ |
| | $Y_{nl} = Y_{sl}$ |
| | $Y_{su} - Y_{sl} < Y_{min}$ |
| Type 14 | $Y_{nu} > Y_{su}$ |
| | $Y_{nl} < Y_{sl}$ |
| | $Y_{nl} > Y_{su}$ |
| | $Y_{su} - Y_{sl} < Y_{min}$ |
| Type 15 | $Y_{nu} > Y_{su}$ |
| | $Y_{nl} > Y_{sl}$ |
| | $Y_{nl} < Y_{su}$ |
| | $Y_{su} - Y_{sl} < Y_{min}$ |
| | OR |
| | $Y_{su} - Y_{nl} < Y_{min}$ |
| | OR |
| | $Y_{nu} - Y_{su} < Y_{min}$ |
| Type 16 | $Y_{nl} \geqq Y_{su}$ |
| Type 17 | $Y_{nl} < Y_{su}$ |

It can be readily appreciated that the same "type" definitions would apply in the case of horizontal slivers, with the x-coordinates ($X_{nu}$, $X_{nl}$, $X_{su}$, $X_{sl}$) being the critical parameters rather than the y-coordinates.

By utilizing the above defined types to categorize the desirability of a neighbor for combining with a sliver, and by further insuring that as many slivers in each subfield are eliminated as possible, the overall pattern is optimized.

Now referring to FIGS. 24–29, the process of eliminating a sliver within a subfield will be described in greater detail. As was discussed earlier, the pattern is divided into pattern sections to create subfields (recall FIG. 1). The subfields are sequentially processed, and all slivers are identified and combined within a subfield before moving on to the next area. Thus, the following discussion relates to the process of identifying and combining slivers within a given subfield. It therefore can be appreciated that the process is performed for each subfield in substantially the same manner.

Figure 24:
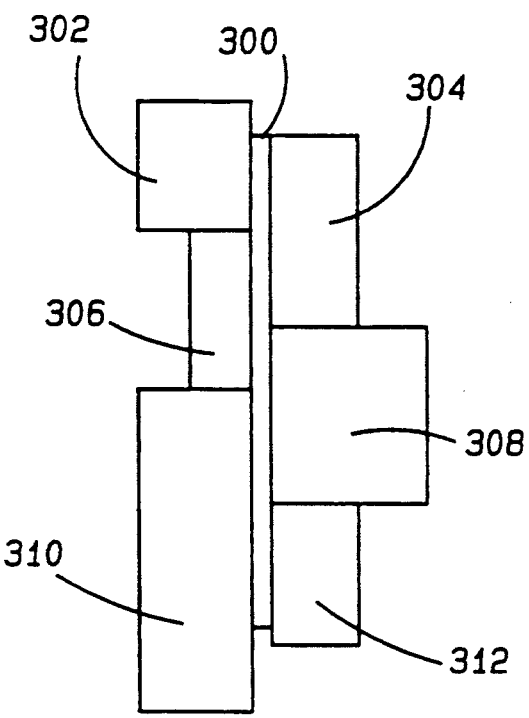

As shown in FIG. 24, the exemplar subfield has one sliver 300 and six possible neighbors 302-312. Because this is a vertical sliver, processing proceeds from top to bottom. If it were a horizontal sliver, processing would proceed from right to left. This way, processing always proceeds from higher coordinate values to lower coordinate values, thereby easing implementation of the presently preferred embodiment. As the algorithm interrogates the sliver from top to bottom, neighbors 302 and 304 are encountered first. Since either one of these neighbors could be used to combine the upper portion of the sliver 300, the preferability of one neighbor over the other must be determined. Therefore, the type of the neighbors is determined and the more preferable type is selected. In this example, neighbor 302 is type =6 with respect to the sliver 300 and neighbor 304 is type =5. Here, a type =5 combination results in one rectangle while a type =6 combination results in two rectangles. Also, the type =5 combination combines a larger portion of the sliver than does the type =6 combination. Thus, neighbor 304 is preferable and is selected for combining with the sliver.

Figure 25:
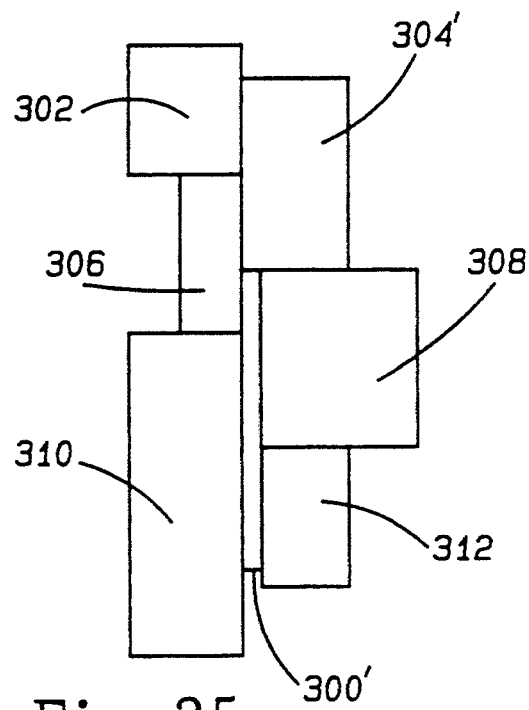
Figure 26:
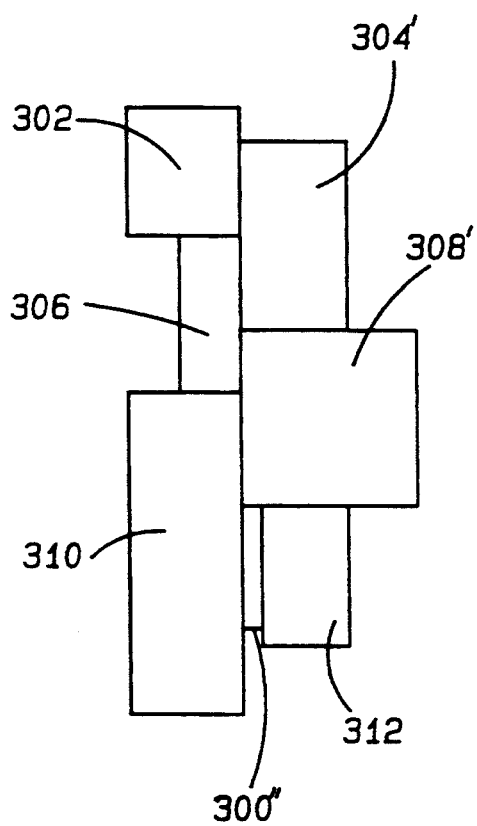
Figure 27:
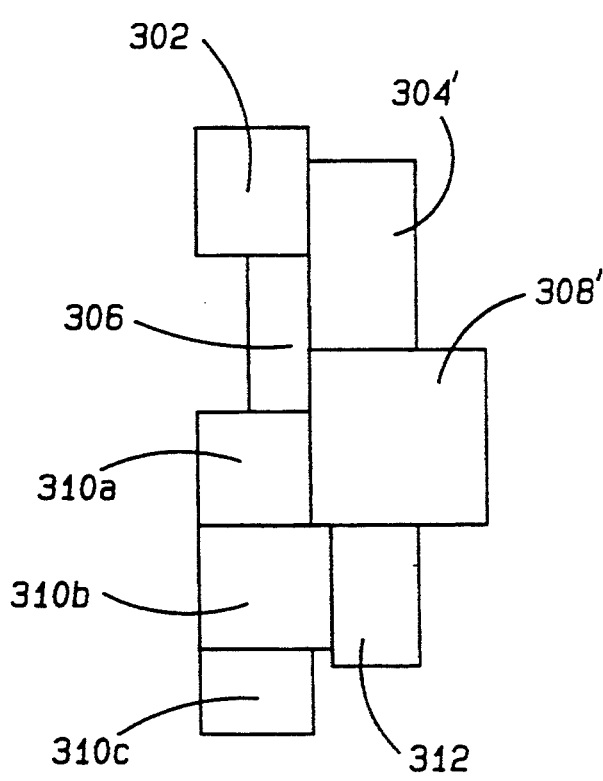

After the first combination process, the subfield appears as shown in FIG. 25. As can be seen, the sliver 300' has been partially eliminated by combining it into neighbor 304'. Now, the algorithm continues processing the sliver 300' in a top to bottom manner and identifies the next two possible neighbors 306 and 308. Neighbor 306 is type =6 and neighbor 308 is type =5. Since neighbor 308 is preferable, the sliver 300' is combined with it and the subfield now appears as shown in FIG. 26. Once again, the sliver 300'' has been partially eliminated by combining it with a neighbor 308'. Finally, the last two neighbors are considered, and neighbor 310 is determined to be type =4 and neighbor 312 is type =7 with respect to the sliver 300''. If the sliver were combined with neighbor 310, it would result in three rectangles. However, if combined with neighbor 312, a new sliver would be created. Thus, it is preferable to combine the sliver 300'' with neighbor 310. This leaves the region as shown in FIG. 27. As can be seen, the entire sliver has been eliminated. Therefore this subfield has been fully optimized, leaving rectangular areas 302, 306 and 312 unaffected by the elimination of the sliver, and rectangles 304, 308 and 310 converted into rectangles 304', 308' and 310a, 310b and 310c. Optimization of other subfields would proceed in like fashion.

It should be appreciated that the types, as defined, are generally numbered in ascending order from most preferable to least preferable for combining. Thus, the method's task in the preferred embodiment is made easier since it simply has to compare neighbor types and select the lowest type value in order to select the most preferable neighbor for combining in most cases.

While the goal is to completely eliminate all slivers within a subfield, there are occasions where it is impossible to completely eliminate all slivers within an area. For example, as shown in FIG. 28, in the process of trying to eliminate vertical sliver 400 by combining it with neighbor 402, a new horizontal sliver 406 is created. During the next iteration of the algorithm, sliver 406 is combined with neighbor 404, resulting in another new sliver 408. This final arrangement, depending upon the specific application for which the preferred embodiment is attempting to optimize the pattern, may or may not be preferable over the original sliver arrangement. The fact that new slivers will be created and that a final, uncombinable sliver will result can be anticipated by observing the type relationships between both the neighbor and the sliver and the neighbor and its neighbor. Specifically, neighbor 402 is type =8 with respect to sliver 400, and neighbor 404 is type =9 with respect to neighbor 402 (as well as sliver 406). Since a type =8 combination and a type =9 combination both create new slivers, the net result is that a portion of the original sliver 400 will remain behind as a sliver 408 which is uncombinable. Thus, by observing the type relationship between the present sliver and its neighbor as well as the anticipated sliver and its neighbor, it can be determined that an uncombinable sliver will be the final result.

The fact that new slivers may be created in the process of trying to eliminate existing slivers is not always fatal, however. For example, as shown in FIG. 29, despite the fact that a new sliver is created in the process of combining an existing sliver, the new sliver can eventually be eliminated by a further combination process. In this embodiment, the first "pass" in a subfield is "vertical". During this pass, vertical sliver 500 is detected and processed from top-to-bottom. Given that, it can be seen that neighbor 502 is type =8 with respect to sliver 500. With respect to the "horizontal" pass, neighbor 504 is type =2 with respect to neighbor 502. After combining sliver 500 with neighbor 502, the resulting horizontal sliver 506 results. On the next, horizontal pass, sliver 506 is examined and it is determined that neighbor 504 is type =2 with respect to sliver 506 and neighbor 502' is type =7 with respect to sliver 506. By combining once again, the final area has no slivers, as shown by rectangles 502' and 504A and 504B. This result could also have been anticipated by simply realizing that since neighbor 504 was type =2 with respect to neighbor 502, any slivers resulting from the partial segmentation of the upper part of neighbor 502 would be fully combinable with neighbor 504 without resulting in further slivers.

Therefore, to take advantage of the ability to anticipate the possibility that new slivers may or may not be combinable, the presently preferred embodiment interrogates neighbor-to-neighbor relationships whenever a sliver-to-neighbor relationship indicates that a new sliver will result from the combinational process. In doing so, the algorithm effectively determines whether newly created slivers can themselves be eliminated or whether they will be uncombinable. To further increase the efficiency of the presently preferred embodiment, each subfield is searched for slivers using multiple, alternating vertical and horizontal passes performed so as to "catch" newly created slivers in a manner similar to that previously discussed in connection with FIG. 29. Furthermore, during the final vertical and horizontal passes to be performed in a subfield, the algorithm can be inhibited from attempting to combine slivers with any neighbor having a type ≧7. In this way, no new slivers will be created during a final pass that would otherwise remain unresolved. Similarly, it can be appreciated that a first set of iterations can be conducted to remove slivers of a smaller size (i.e. 0.5 microns) and further sets of iterations can be conducted to remove larger slivers (i.e. 1.0 microns). In this way, the pattern can be further simplified, thus increasing the efficiency with which the pattern is exposed. It can be appreciated that these, and other, processing rules are suited to particular embodiments and can therefore be modified to best suit the needs of any particular application.

The foregoing description of the presently preferred embodiment was provided for the purposes of illustration. It can be appreciated by one of ordinary skill in the art that modification to the presently preferred embodiment could be made without departing from the spirit or scope of the invention.

What is claimed is:

1. In a method of fabricating a semiconductor comprising the steps of coating a surface with a resist material, defining a desired exposure pattern formed by a plurality of rectangular figures wherein at least some of said rectangular figures are abutting, and focusing an electron beam on said rectangular figures to expose the resist material, a method of optimizing said fabricating method comprising the steps of:

identifying sliver rectangular figures having at least one dimension less than a focus dimension of said electron beam;

identifying at least one neighbor rectangular figure adjacent to said sliver rectangular figure;

combining said at least one neighbor rectangular figure with said sliver rectangular figure to create at least one new rectangular figure with dimensions larger than said focus dimension and to reduce sliver rectangular figures; and exposing said new rectangular figure identified on the resist material.

2. The method of optimizing of claim 1 further comprising the step of dividing said desired exposure pattern into a plurality of subfields.

3. The method of optimizing of claim 2 wherein said steps of identifying said sliver rectangular figures and said neighbor rectangular figures to said sliver rectangular figures are performed in one subfield.

4. The method of optimizing of claim 1 wherein said combining step further includes the step of merging the sliver rectangular figure with at least one neighbor rectangular figure.

5. The method of optimizing of claim 1 wherein said combining step further includes the steps of splitting at least one neighbor rectangular figure into a plurality of new neighbor rectangular figures and merging said sliver with at least one of said new neighbor rectangular figures.

6. The method of optimizing of claim 1 wherein said sliver rectangular figure abuts first and second neighbor rectangular figures and said combining step further includes the steps of:

combining said sliver rectangular figure with said first neighbor rectangular figures;

determining the number of new rectangular figures resulting from combining said sliver with said first neighbor rectangular figure;

determining if all or a portion of said sliver rectangular figure would be combined with said first neighbor rectangular figure; and determining whether any of said new rectangular figures would be a new sliver rectangular figure.

7. The method of optimizing of claim 6 further comprising the steps of:

combining said sliver rectangular figure with said second neighbor rectangular figure;

determining the number of new rectangular figures resulting from combining said sliver with said second neighbor rectangular figure;

determining if all or a portion of said sliver rectangular figure would be combined with said second neighbor rectangular figure; and determining whether any of said new rectangular figures would be a new sliver rectangular figure.

8. The method of optimizing of claim 7 further comprising the steps of:

selecting, for combination with said sliver rectangular figure, one of said first and second neighbor rectangular figure which provides (a) the fewest new rectangular figures, (b) the removal of the greatest portion of the said sliver rectangular figure, and (c) the fewest new slivers.

9. The method of optimizing of claim 1 further comprising the steps of:

identifying at least one vertical sliver rectangular figure having a horizontal width dimension less than the focus dimension, and abutting a plurality of neighbor rectangular figures along opposing vertical sides thereof;

scanning and combining, using a vertical pass, all or a portion of said vertical sliver rectangular figure with one of said abutting neighbor rectangular figures which lies horizontally adjacent one vertical end of said vertical sliver rectangular figure to create a new rectangular figure having dimensions greater than said focus dimension;

combining remaining portions of said vertical sliver rectangular figure with others of said plurality of abutting neighbor rectangular figures until all or a substantial portion of said sliver rectangular figure is combined by said vertical pass.

10. The method of optimizing of claim 9 further comprising the steps of:

identifying at least one horizontal sliver rectangular figure having a vertical width dimension less than the focus dimension and abutting a plurality of neighbor rectangular figures along opposing horizontal sides thereof;

scanning and combining, using a horizontal pass, all or a portion of said horizontal sliver rectangular figure with one of said neighbor rectangular figures which lies vertically adjacent one horizontal end of said horizontal sliver rectangular figure to create a new rectangular figure having dimensions greater than said focus dimension; and combining remaining portions of said horizontal sliver rectangular figure with others of said plurality of abutting neighbor rectangular figures until all or a substantial portion of said horizontal sliver rectangular figure is combined by said horizontal pass.

11. The method of optimizing of claim 10 wherein said horizontal and vertical slivers are combined using alternating horizontal and vertical passes.

* * * * *